(12) United States Patent
Yoon et al.

(10) Patent No.: US 8,058,164 B2
(45) Date of Patent: Nov. 15, 2011

(54) METHODS OF FABRICATING ELECTRONIC DEVICES USING DIRECT COPPER PLATING

(75) Inventors: Hyungsuk Alexander Yoon, San Jose, CA (US); Fritz Redecker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 919 days.

(21) Appl. No.: 11/810,287

(22) Filed: Jun. 4, 2007

(65) Prior Publication Data

US 2008/0299772 A1    Dec. 4, 2008

(51) Int. Cl.
*H01L 21/4763* (2006.01)

(52) U.S. Cl. ........ 438/627; 438/650; 438/678; 438/687; 257/E21.586

(58) Field of Classification Search .................. 438/618, 438/627, 650, 678, 687; 257/E21.585, E21.586
See application file for complete search history.

(56) References Cited

U.S. PATENT DOCUMENTS

| | | | | |
|---|---|---|---|---|
| 5,950,108 | A * | 9/1999 | Wu et al. ...................... | 438/685 |
| 6,399,496 | B1 | 6/2002 | Edelstein et al. | |
| 6,610,151 | B1 * | 8/2003 | Cohen ........................... | 118/719 |
| 6,624,073 | B2 * | 9/2003 | Sun et al. ...................... | 438/687 |
| 6,812,143 | B2 | 11/2004 | Lane et al. | |
| 6,974,768 | B1 * | 12/2005 | Kailasam ...................... | 438/625 |
| 7,135,404 | B2 | 11/2006 | Baskaran et al. | |
| 7,135,408 | B2 | 11/2006 | Wu et al. | |
| 7,153,400 | B2 | 12/2006 | Ravkin et al. | |
| 7,191,787 | B1 | 3/2007 | Redeker et al. | |
| 7,220,451 | B2 * | 5/2007 | Aaltonen et al. ......... | 427/255.29 |
| 7,297,190 | B1 | 11/2007 | Dordi et al. | |
| 7,306,662 | B2 | 12/2007 | Vaskelis et al. | |
| 7,585,765 | B2 * | 9/2009 | Yang et al. ................... | 438/637 |
| 7,592,259 | B2 * | 9/2009 | Dordi et al. .................. | 438/687 |
| 2003/0171003 | A1 | 9/2003 | Kim et al. | |

(Continued)

FOREIGN PATENT DOCUMENTS

WO   WO 2008/151104 A1   12/2008

OTHER PUBLICATIONS

Characteristics of Ruthenium Films Prepared by Chemical Vapor Deposition Using Bis(ethylcyclopentadienyl) Ruthenium Precursor, Yuichi Matsui, et al., *Electrochemical and Solid State Letters*, 5, (1) C18-C21 (available electronically on Nov. 15, 2001), (2002).

(Continued)

*Primary Examiner* — Tuan N. Quach

(74) *Attorney, Agent, or Firm* — Larry Williams

(57) ABSTRACT

The present invention relates to methods and structures for the metallization of semiconductor devices. One aspect of the present invention is a method of forming a semiconductor device having copper metallization. In one embodiment, the method includes providing a patterned wafer having a diffusion barrier for copper; depositing a copperless seed layer on the diffusion barrier effective for electrochemical deposition of gapfill copper. The seed layer is formed by a conformal deposition process and by a nonconformal deposition process. The method further includes electroplating copper gapfill onto the seed layer. Another aspect of the invention includes electronic devices made using methods and structures according to embodiments of the present invention.

17 Claims, 7 Drawing Sheets

U.S. PATENT DOCUMENTS

| | | | |
|---|---|---|---|
| 2004/0175492 A1* | 9/2004 | Won et al. | 427/96.1 |
| 2004/0175928 A1* | 9/2004 | Abell | 438/627 |
| 2005/0124153 A1* | 6/2005 | Cohen | 438/634 |
| 2005/0218523 A1* | 10/2005 | Dubin | 257/762 |
| 2005/0284767 A1 | 12/2005 | Dordi et al. | |
| 2006/0060301 A1* | 3/2006 | Lazovsky et al. | 156/345.26 |
| 2006/0128150 A1* | 6/2006 | Gandikota et al. | 438/681 |
| 2006/0165892 A1 | 7/2006 | Weidman | |
| 2006/0211228 A1* | 9/2006 | Matsuda | 438/575 |
| 2006/0260932 A1 | 11/2006 | Ravkin et al. | |
| 2006/0267205 A1* | 11/2006 | Koerner | 257/762 |
| 2006/0283716 A1 | 12/2006 | Hafezi et al. | |
| 2007/0048447 A1 | 3/2007 | Lee et al. | |
| 2007/0292603 A1 | 12/2007 | Dordi et al. | |
| 2008/0083989 A1* | 4/2008 | Aoi et al. | 257/751 |

OTHER PUBLICATIONS

Transition Metals Show Promise as Copper Barriers, Ishita Goswami and Ravi Laxman, *Semiconductor International Magazine* (2004, Issue 5—available electronically on May 1, 2004 at: http://www.semiconductor.net/article/CA411456.html).

Seed Layer Free Conformal Ruthenium Film Deposition on Hole Substrates by MOCVD Using (2,4-Dimethylpentadienyl) (ethylcyclopentadienyl) Ruthenium, Kazuhisa Kawano, et al., *Electrochemical and Solid State Letters*, 9 (7) C107-C109 (available electronically on May 5, 2006).

U.S. Appl. No. 11/641,364, filed Dec. 18, 2006, Inventors: Yezdi Dordi, et al.

* cited by examiner

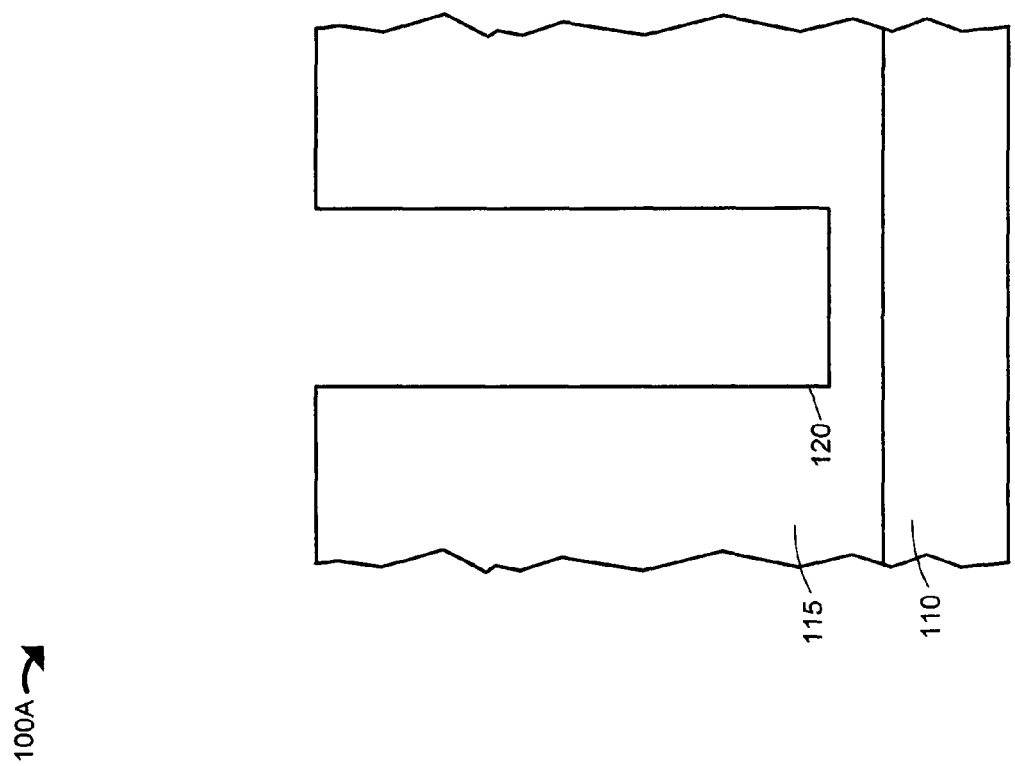

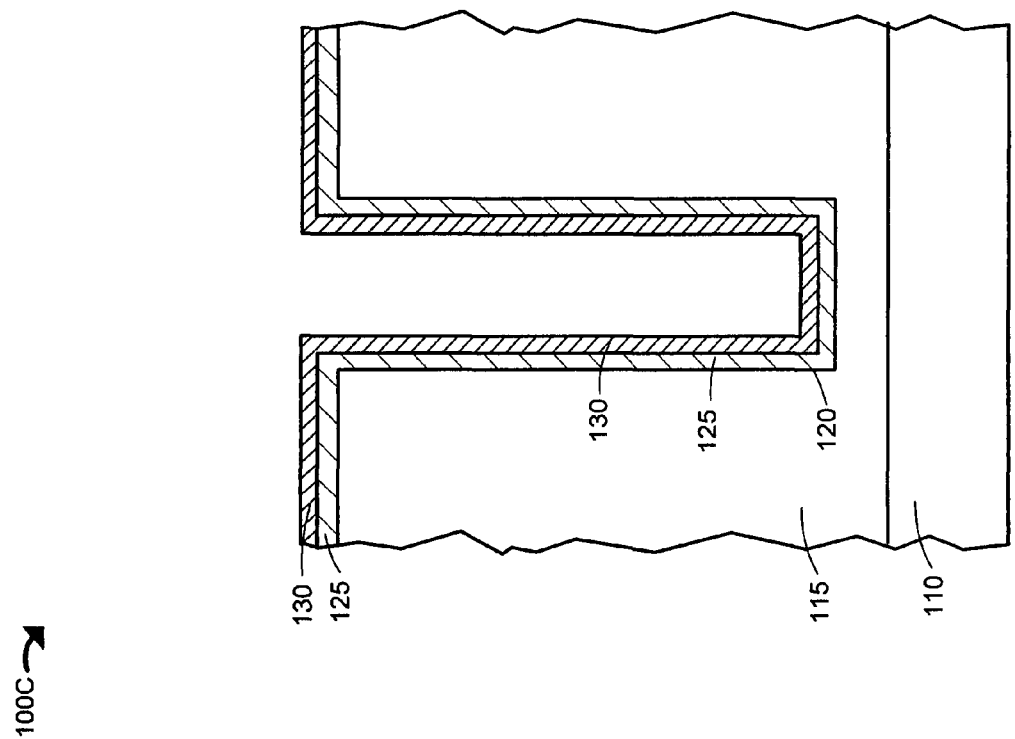

METHODS OF FABRICATING ELECTRONIC DEVICES USING DIRECT COPPER PLATING

CROSS-REFERENCE

The present application is related to U.S. patent application Ser. No. 11/641,364, filed Dec. 18, 2006, titled "METHODS AND SYSTEMS FOR BARRIER LAYER SURFACE PASSIVATION," to Yezdi DORDI, John BOYD, Fritz REDEKER, William THIE, Tiruchirapalli ARUNAGIRI, and Hyungsuk Alexander YOON; U.S. patent application Ser. No. 11/382,906, filed May 25, 2006; U.S. patent application Ser. No. 11/427,266, filed Jun. 28, 2006; U.S. patent application Ser. No. 11/461,415, filed Jul. 27, 2006; U.S. patent application Ser. No. 11/514,038, filed Aug. 30, 2006; U.S. patent application Ser. No. 10/357,664, filed Feb. 3, 2003; U.S. patent application Ser. No. 10/879,263, filed Jun. 28, 2004; and U.S. patent application Ser. No. 10/607,611, filed Jun. 27, 2003; all of these patents and/or applications are incorporated herein, in their entirety, by this reference.

BACKGROUND

This invention relates to improved methods and systems for the metallization of semiconductor devices such as integrated circuits, memory cells, and the like that use copper metallization; more specifically this invention relates to methods and systems for copper-based metallization of silicon integrated circuits.

An important part of the fabrication of semiconductor devices is the metallization of the devices to electrically interconnect the device elements. For many such devices, the metallization of choice includes the use of copper metal lines. Metallization systems that use copper metal lines also must use a barrier material to isolate the copper from copper sensitive areas of the electronic devices. Some of the commonly used barrier layers for copper metallization are materials such as tantalum, such as tantalum nitride, and such as combined layers of tantalum and tantalum nitride.

The usual fabrication process for metallization systems that use copper involves the deposition of copper onto the barrier layers. Typically, a seed layer of copper is deposited onto the barrier layer; the seed layer of copper is then followed by a copper gapfill layer which provides the bulk copper for filling trenches and vias for the metallization. A preferred process for depositing the copper gapfill is electrochemical plating which typically uses a seed layer of copper.

One problem that occurs in the standard technology used for copper metallization is that many of the preferred barrier materials such as tantalum and tantalum nitride, if exposed to air for extended periods of time, can form oxides such as tantalum oxide and tantalum oxynitride on the surface of the barrier layer. It is known that electroless deposition of copper onto the barrier layer for use as a seed layer is inhibited if there is oxide present on the barrier layer. In addition, copper does not adhere to the oxide on the barrier layer as well as it adheres to the pure barrier metal or metal rich barrier layer surface, such as tantalum and tantalum-rich surface on tantalum nitride.

Another problem that occurs for the standard technology is that the requirements for new device technologies include using thinner copper layers as seed layers. These seed layers are often deposited by a physical vapor deposition process which has poor step coverage and produces an overhang for trenches and vias that can significantly narrow the opening of vias and trenches. Each of these problems can contribute to degrading the quality of electroplated gapfill copper. The overhang produced by deposition of copper by physical vapor deposition can cause pinch off for the electroplated copper, possibly leaving a liquid filled void in the gapfill copper. The requirements for a thinner copper layer for the seed layer may result in very thin copper layers on the sidewalls of features to be coated. The copper layer may even be discontinuous along the sidewall and can further contribute to formation of voids in the gapfill copper. The poor quality copper gapfill that may result from the new requirements for seed layers can have a significant impact on the reliability of the electronic devices using such copper metallization systems.

Clearly, there are numerous applications requiring high-performance, high reliability electronic devices. The problems that occur for the standard technology for fabricating electronic devices using copper metallization indicate there is a need for methods and structures that can allow the fabrication of electronic devices using copper metallization with improved performance and improved reliability. More specifically, there is a need for copper metallization systems that do not require standard technology copper seed layers for deposition of copper gapfill. There is also a need for metallization processes that avoid the problems associated with oxide formation on the barrier materials.

SUMMARY

This invention pertains to methods and structures for fabricating semiconductor devices. The present invention seeks to overcome one or more of the deficiencies of the standard technologies for fabricating semiconductor devices such as integrated circuits, memory cells, and the like that use copper metallization.

One aspect of the present invention is a method of fabricating semiconductor devices having copper metallization. In one embodiment, the method includes providing a patterned wafer having a diffusion barrier for copper; depositing a copperless seed layer on the diffusion barrier effective for electrochemical deposition of gapfill copper. The seed layer is partially formed by a conformal deposition process and partially formed by a nonconformal deposition process. The method further includes electroplating copper gapfill onto the seed layer. Another aspect of the present invention is a seed layer structure for fabricating semiconductor devices that use copper metallization. Still another aspect of the present invention includes semiconductor devices fabricated using the methods disclosed infra.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

BRIEF DESCRIPTION OF THE DRAWINGS

FIG. 3A is a diagram of a substrate to be processed according to an embodiment of the present invention.

FIG. 3C is a diagram of the substrate from FIG. 3A partially processed according to an embodiment of the present invention.

Figure 1:
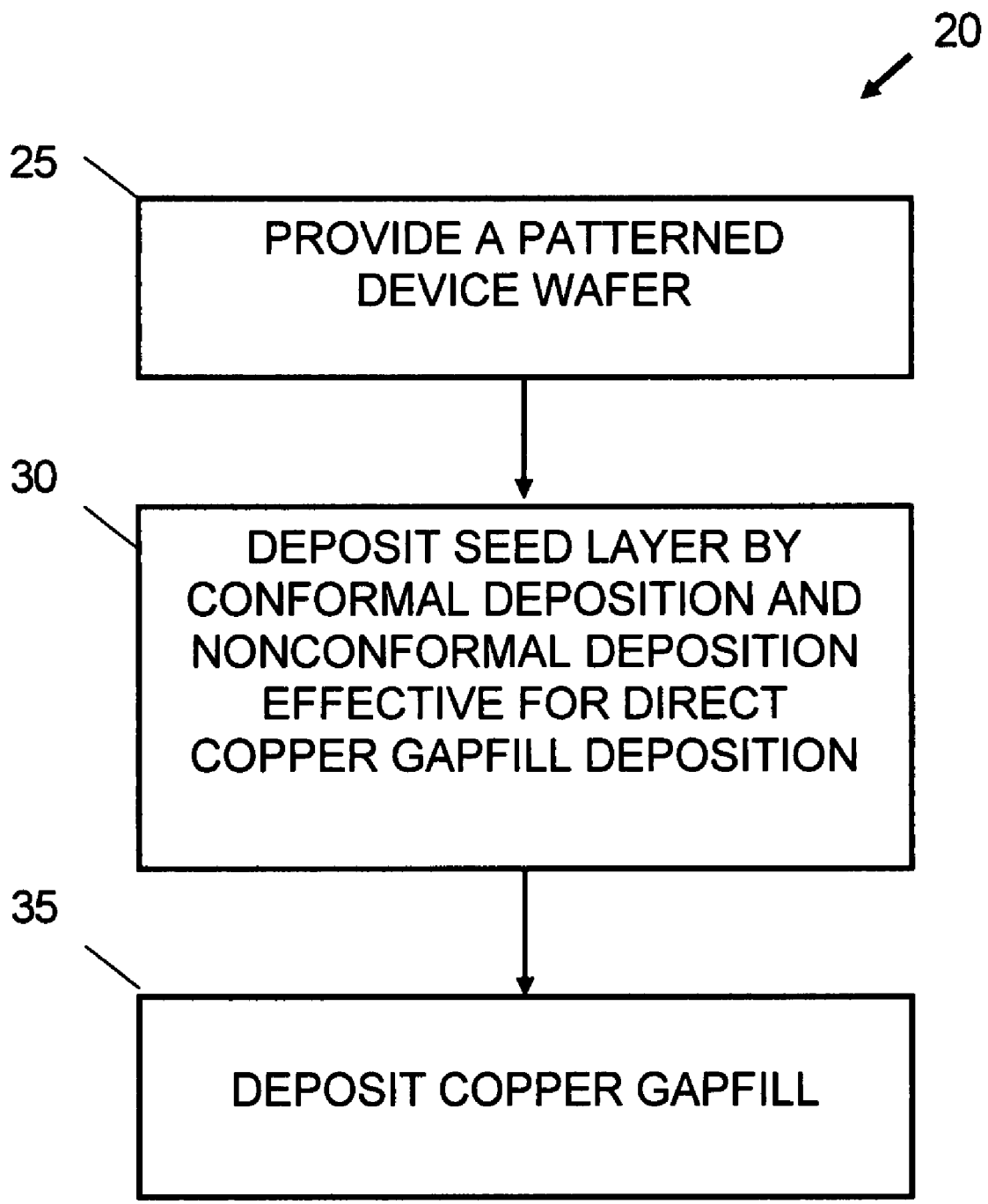
FIG. 1 is a process flow diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to metallization for semiconductor devices using barrier layers and copper lines. The operation of embodiments of the present invention will be discussed below, primarily, in the context of transition metal barrier layers and copper metal lines for silicon integrated circuits. However, it is to be understood that embodiments in accordance with the present invention may be used for other metallization systems for which direct formation of the copper gapfill, without a seed layer of copper, is needed.

In the following description of the figures, identical reference numerals have been used when designating substantially identical elements or steps that are common to the figures.

Reference is now made to FIG. 1 where there is shown a process flow diagram 20 according to one embodiment of the present invention. Process flow diagram 20 shows a method of depositing a copper gapfill layer onto a transition metal barrier layer for integrated circuit metallization. Process flow diagram 20 includes step 25, step 30, and step 35.

Step 25 provides a patterned integrated circuit wafer. Optionally, the integrated circuit wafer may be a semiconductor wafer such as a silicon wafer. As an alternative, the integrated circuit wafer may be a wafer of a material other than a semiconductor such as a glass wafer, such as a sapphire wafer, or other material used for supporting integrated circuits. The pattern formed on the wafer usually includes features such as trenches and such as vias for interconnect metallization. The pattern may be formed by one or more processes that may include one or more lithography processes, deposition processes, etch processes, and planarization processes.

Step 30 includes deposition of a seed layer effective for direct copper gapfill deposition. The seed layer is deposited, in part, by a conformal deposition process and, in part, by a nonconformal deposition process. Preferably, the seed layer is deposited so as to be effective to substantially prevent or retard oxidation of the barrier layer. Preferred seed layers for embodiments of the present invention comprise elements other than copper. More specifically, the preferred seed layers for embodiments of the present invention are copperless seed layers. For the purpose of this disclosure, the term "copperless" is defined here as being substantially free of copper or primarily containing elements other than copper. Furthermore, preferred embodiments of the present invention use a seed layer that is also resistant to oxide formation and does not form a surface oxide during processing that interferes with follow-on deposition of gapfill metal.

Step 35 includes deposition of the gapfill metal. According to a preferred embodiment of the present invention, the gapfill metal comprises copper. Preferably, process flow 20 is carried out so that there is substantially no oxide present between the barrier layer and the seed layer and so that there is substantially no oxide present between the seed layer and the gapfill metal. According to preferred embodiments of the present invention, the gapfill metal comprises copper deposited by electrochemical plating.

A further step (not shown in FIG. 1) that is an option for some embodiments of the present invention includes treating the surface of the barrier layer after the barrier has been formed. Treating the surface of the barrier layer may be performed in a variety of ways. The step is performed so as to prepare the surface of the barrier layer for follow-on processing steps. Treating the surface of the barrier layer is primarily done to improve the surface adhesion or to improve the contact resistance for layers deposited on the barrier layer. According to one embodiment of the present invention, treating the surface of the barrier layer is accomplished by subjecting the surface of the barrier layer to a hydrogen containing plasma. The hydrogen containing plasma may be configured to remove contaminants on the surface of the barrier layer such as to decompose metal oxides formed on the surface of the barrier layer so as to produce a metal rich surface at the surface of the barrier layer. An example of a suitable hydrogen containing plasma for treating the surface of the barrier layer is described in commonly owned U.S. patent application Ser. No. 11/514,038, filed on Aug. 30, 2006 and is incorporated herein, in its entirety, by this reference.

For embodiments of the present invention, the diffusion barriers have properties sufficient to substantially prevent diffusion of the gapfill metal used in the semiconductor devices. Some examples of suitable diffusion barriers include, but are not limited to, tantalum carbon nitride, tantalum nitride, titanium nitride, titanium silicon nitride, tungsten nitride, and tungsten carbon nitride. Preferred diffusion barriers for semiconductor devices with copper metallization use compounds containing tantalum, such as tantalum nitride.

Seed layers for embodiments of the present invention preferably include oxidation resistant electrical conductors such as oxidation resistant metals. Some examples of suitable seed layers include, but are not limited to, rhenium, osmium, iridium, cobalt, nickel, platinum, and palladium.

Embodiments of the present invention may be accomplished using a variety of deposition processes capable of providing controlled conformal deposition and controlled nonconformal deposition for formation of the seed layer. It is known that by selecting the proper combination of materials and process conditions, conformal deposition can be accomplished using processes such as atomic layer deposition and chemical vapor deposition. There are also options as to how the atomic layer deposition processes are performed and as to how the chemical vapor deposition processes are performed. It is also known that by selecting the proper combination of materials and process conditions, nonconformal deposition can be accomplished using chemical vapor deposition. The general processes of atomic layer deposition and chemical vapor deposition are well known in the art. There are multiple processes to choose from for forming seed layers according to embodiments of the present invention.

Another option to achieve nonconformal deposition to practice embodiments of the present invention includes using traditional nonconformal deposition processes such as line-of-sight deposition processes. Some examples of traditional nonconformal deposition processes include, but are not limited to, sputtering, vacuum evaporation, and other physical vapor deposition processes. The general process of physical vapor deposition is well known in the art. There are multiple processes to choose from for forming seed layers according to embodiments of the present invention.

Embodiments of the present invention can be carried out using any types or combinations of deposition processes that provide suitable seed layers for embodiments of the present invention. Some examples of specific options for embodiments of the present invention are as follows: The conformal deposition process includes atomic layer deposition. The conformal deposition process includes chemical vapor deposition. The nonconformal deposition process includes physical vapor deposition. The nonconformal deposition process includes metal evaporation or sputtering. The conformal deposition process is accomplished by atomic layer deposition and the nonconformal deposition process is accomplished by chemical vapor deposition. The conformal deposition process is accomplished by atomic layer deposition and the nonconformal deposition process is accomplished by physical vapor deposition.

For a preferred embodiment of the present invention, the nonconformal deposition process produces a thicker deposit over the field areas than in the patterned features. In other words, the nonconformal portion of the seed layer is deposited so that it is thicker on the top surface of the substrate and does not increase the thickness of the seed layer deposited in the features, i.e., along the sidewalls and bottoms of the features, significantly enough to interfere with the gapfill of the features. Furthermore, preferred embodiments of the present invention use materials and processes for depositing the nonconformal portion of the seed layer so that overhanging deposits at the opening of the vias and trenches do not narrow the opening enough to significantly interfere with the gapfill of the features. More specifically, the nonconformal deposition process is performed so as to reduce the amount of overhanging deposit for the trenches and vias. The reduction of the overhanging deposit decreases the incidences of pinch off and void formation in the gapfill copper.

The thickness of the conformal portion of the seed layer is determined by the thickness needed to provide substantially continuous coverage over the substrate, particularly in the features that will receive the gapfill metal, so that a gapfill metal of sufficient quality can be electrochemically deposited in the features. Preferably, the thickness of the seed layer is sufficient to enable direct electrochemical plating of copper gapfill without need for a seed layer comprising copper.

The thickness of the nonconformal portion of the seed layer is determined by the resistivity of the seed layer. Seed layers according to embodiments of the present invention are copperless seed layers intended to replace seed layers that comprise copper. Copper is a good electrical conductor and typically has an electrical conductivity that is significantly lower than that of materials preferred for seed layers according to embodiments of the present invention. The thickness of the nonconformal portion of the seed layer is selected so as to provide an electrical resistance for the substrate that is about equal to the electrical resistance for a substrate that uses a seed layer of copper. For a preferred embodiment of the present invention, the nonconformal deposition process increases the thickness of the copperless seed layer so that the copperless seed layer has an electrical resistance suitable for electrochemical plating gapfill copper. In other words, the seed layer formed in step 30 is sufficiently thick to eliminate the need for a seed layer comprising copper and step 35 includes the deposition of an electroplated copper gapfill layer on the seed layer formed in step 30. Electrochemical plating is a well-known wet process. An example of a suitable electrochemical plating process and equipment is described in commonly owned U.S. Pat. Ser. No. 11/494,997, filed Jul. 28, 2006, titled "APPARATUS AND METHOD FOR DEPOSITING AND PLANARIZING THIN FILMS OF SEMICONDUCTOR WAFERS," inventors Ravkin et al., which is incorporated herein, in its entirety, by this reference.

As an option for some embodiments of the present invention, deposition of the conformal portion of the seed layer and deposition of the nonconformal portion of the seed layer may be accomplished using the same process module. In other words, the deposition of one portion may be performed and immediately followed by deposition of the other portion without removing the wafer from the process chamber. Alternatively, suitable results can also be obtained using a process module configured specifically for the conformal deposition and using a second process module configured specifically for the nonconformal deposition.

According to one embodiment of the present invention, the conformal deposition portion is deposited before the nonconformal deposition portion. According to another embodiment of the present invention, the nonconformal deposition portion is deposited before deposition of the conformal deposition portion.

Figure 2:
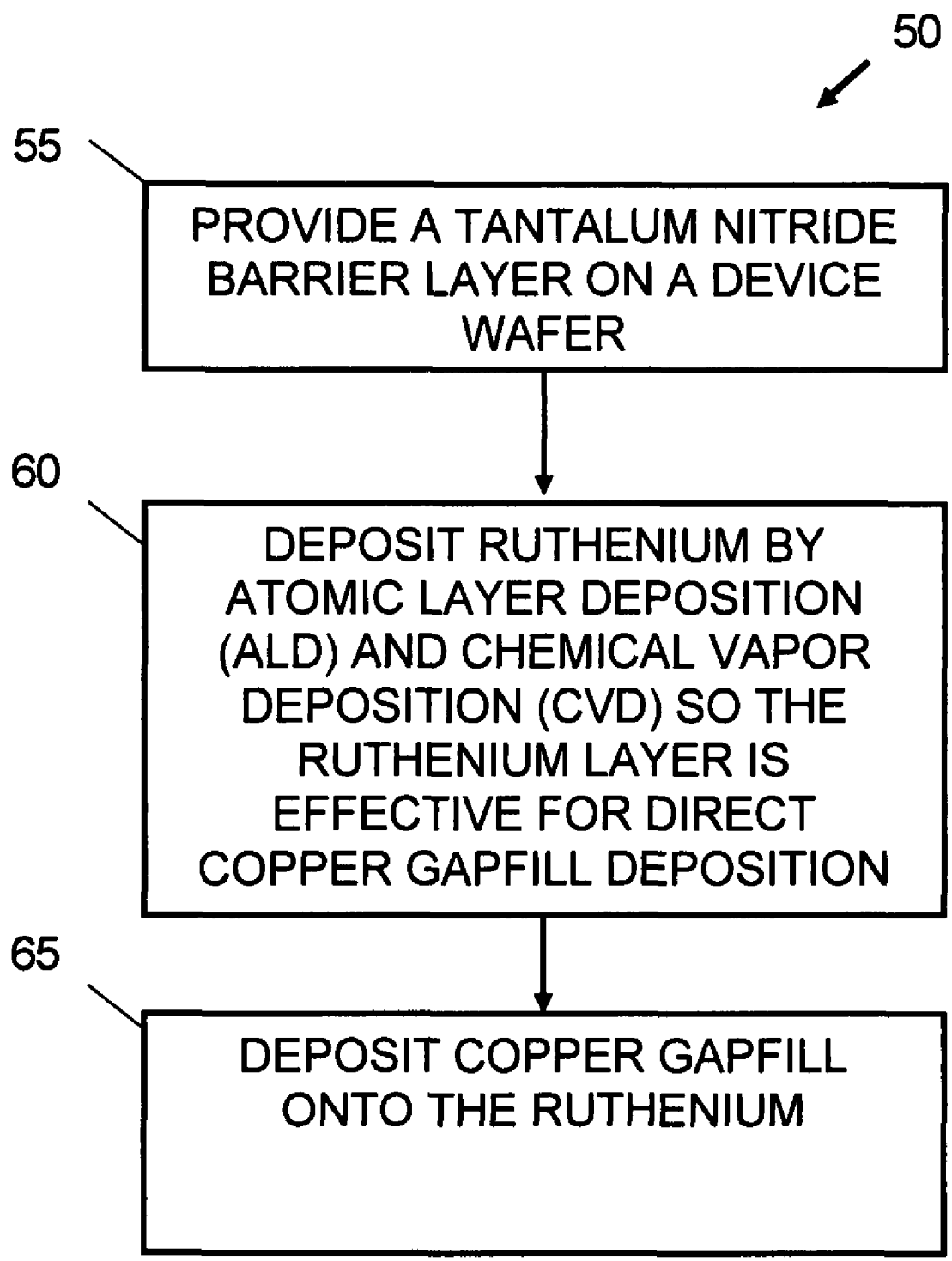
FIG. 2 is a process flow diagram of an embodiment of the present invention.

Reference is now made to FIG. 2 where there is shown a process flow diagram 50 according to a preferred embodiment of the present invention. Process flow diagram 50 shows a method of depositing a copper gapfill layer using ruthenium as a seed layer for integrated circuit metallization. Process flow diagram 50 includes step 55, step 60, and step 65.

Step 55 provides a patterned integrated circuit wafer that includes a tantalum nitride barrier layer to prevent diffusion of gapfill copper. Optionally, the integrated circuit wafer may be a semiconductor wafer such as a silicon wafer. As an alternative, the integrated circuit wafer may be a wafer of a material other than a semiconductor such as a glass wafer, such as a sapphire wafer, or other material used for supporting integrated circuits. The pattern formed on the wafer usually includes features such as trenches and such as vias for interconnect metallization as used in damascene or dual damascene structures. The pattern may be formed by one or more processes that may include one or more lithography processes, deposition processes, etch processes, and planarization processes.

Step 60 includes atomic layer deposition of ruthenium to produce a conformal portion and chemical vapor deposition of ruthenium to produce a nonconformal portion. The ruthenium is deposited onto the barrier layer. Preferably, the atomic layer deposition of ruthenium is done so as to be effective to substantially prevent or retard oxidation of the barrier layer. As an option for some embodiments of the present invention, the seed layer comprises substantially pure ruthenium rather than ruthenium alloyed with another metal.

Step 65 includes deposition of gapfill copper. Preferably, process flow 50 is carried out so that there is substantially no oxide present between the barrier layer and the atomic layer deposition of ruthenium.

A further step (not shown in FIG. 2) that is optional for some embodiments of the present invention includes treating the surface of the barrier layer after the barrier has been formed. Treating the surface of the barrier layer may be performed in a variety of ways. The step is performed so as to prepare the surface of the barrier layer for follow-on processing steps. Treating the surface of the barrier layer is primarily done to improve the surface adhesion or improve the contact resistance for layers deposited on the barrier layer. According to one embodiment of the present invention, treating the surface of the barrier layer is accomplished by subjecting the surface of the barrier layer to a hydrogen containing plasma. The hydrogen containing plasma may be configured to remove contaminants on the surface of the barrier layer such as to decompose metal oxides formed on the surface of the barrier layer so as to produce a metal rich surface at the surface of the barrier layer. An example of a suitable hydrogen containing plasma for treating the surface of the barrier layer is described in commonly owned U.S. patent application Se. No. 11/514,038, filed on Aug. 30, 2006 and is incorporated herein, in its entirety, by this reference.

The general process of atomic layer deposition of ruthenium is well known in the art. There are multiple processes to choose from for the deposition of ruthenium by atomic layer deposition for step 60. The deposition of ruthenium by atomic layer deposition is performed to provide a conformal layer of ruthenium so as to substantially prevent oxidation of the tantalum nitride layer. Preferably, the ruthenium deposited by atomic layer deposition is substantially continuous and has a thickness sufficient to enable direct electrochemical plating of copper along the sidewalls and bottom surfaces of trenches and vias on the wafer for copper gapfill without need for a seed layer comprising copper.

For a preferred embodiment of the present invention, the deposition of ruthenium by atomic layer deposition uses deposition chemistries that do not substantially oxidize the tantalum nitride barrier layer. Exemplary process chemistries for deposition of ruthenium by atomic layer deposition use a precursor ruthenium compound such as, but not limited to, bis(cyclopentadienyl) ruthenium (II), bis(ethyl cyclopentadienyl)ruthenium (II), bis(isopropyl cyclopentadienyl)ruthenium (II), bis(methyl cyclopentadienyl)ruthenium (II), and (2,4-dimethylpentadienly)(ethylcyclopentadienyl)ruthenium. A preferred chemistry for ALD Ru is bis(ethyl cyclopentadienyl)ruthenium (II)+oxygen or bis(ethyl cyclopentadienyl)ruthenium (II)+hydrogen radicals. A variety of ruthenium compounds can be obtained from commercial suppliers such as Sigma-Aldrich Corp., St. Louis, Mo.

The general process of chemical vapor deposition of ruthenium is well known in the art. There are multiple processes to choose from for the deposition of the CVD ruthenium for step 60. The deposition of ruthenium by chemical vapor deposition is done so as to form a thick layer of ruthenium on the top surfaces of the wafer without substantially increasing the thickness of ruthenium deposited in trenches and vias formed on the wafer. In other words, the CVD ruthenium is deposited so that it is a nonconformal coating that is substantially excluded from deposition into trenches and vias formed on the wafer. The thicker layer of ruthenium is needed so that the electrical resistance of the ruthenium layer is sufficiently low to enable direct electrochemical plating of copper gapfill on the ruthenium. This means that there is no need for a seed layer comprising copper for deposition of the gapfill copper. The use of a nonconformal deposition process for making the thick ruthenium layer reduces the amount of overhang for the trenches and vias and consequently reduces the incidences of pinch off and void formation in the gapfill copper.

Exemplary process chemistries for deposition of the CVD ruthenium use a precursor ruthenium compound such as, but not limited to, the compounds presented above for atomic layer deposition of ruthenium. As a result of having a portion of the ruthenium seed layer deposited by atomic layer deposition, the tantalum nitride barrier layer may be substantially protected from oxidation. This means that additional process chemistries that include the use of oxygen or oxygen compounds can be suitable for the nonconformal deposition of ruthenium. Additional process chemistries that may be used for deposition of the nonconformal portion of the ruthenium seed layer include, but are not limited to, ruthenium acetylacetonate (II), tris(tetramethylheptanedionato)ruthenium (III), tricarbonyl clyclopentadienyl ruthenium (I), and dodecacarbonyl triruthenium (0). Ruthenium compounds for chemical vapor deposition are commercially available from suppliers such as Sigma-Aldrich Corp., St. Louis, Mo.

As an option for some embodiments of the present invention, the deposition of ruthenium by atomic layer deposition and deposition of ruthenium by chemical vapor deposition may be accomplished using the same process module. In other words, the deposition of ruthenium by atomic layer deposition may be performed and immediately followed by deposition of ruthenium by chemical vapor deposition without removing the wafer from the process chamber. However, suitable results can also be obtained using a process module configured for atomic layer deposition of ruthenium and using a second process module configured for chemical vapor deposition of ruthenium.

According to another embodiment of the present invention, the chemical vapor deposition of ruthenium is performed before the atomic layer deposition of ruthenium. According to a preferred embodiment of the present invention, the atomic layer deposition of ruthenium is performed before the chemical vapor deposition of ruthenium.

In a preferred embodiment, the ruthenium deposited in step 60 is sufficiently thick to act as a seed layer for copper deposition. In other words, the nonconformal portion of the seed layer, deposited by chemical vapor deposition, combined with the conformal portion of the seed layer, deposited by atomic layer deposition, provides a deposit having an electrical resistance suitable for electrochemical plating gapfill copper. Step 65 includes the deposition of an electroplated copper gapfill layer on the ruthenium formed in step 60. Electrochemical plating is a well-known wet process. An example of an electrochemical plating process suitable for embodiments of the present invention is described in commonly owned U.S. Pat. No. 7,153,400, filed Jun. 27, 2003, the contents of which are incorporated herein, in their entirety, by this reference.

Figure 3B:
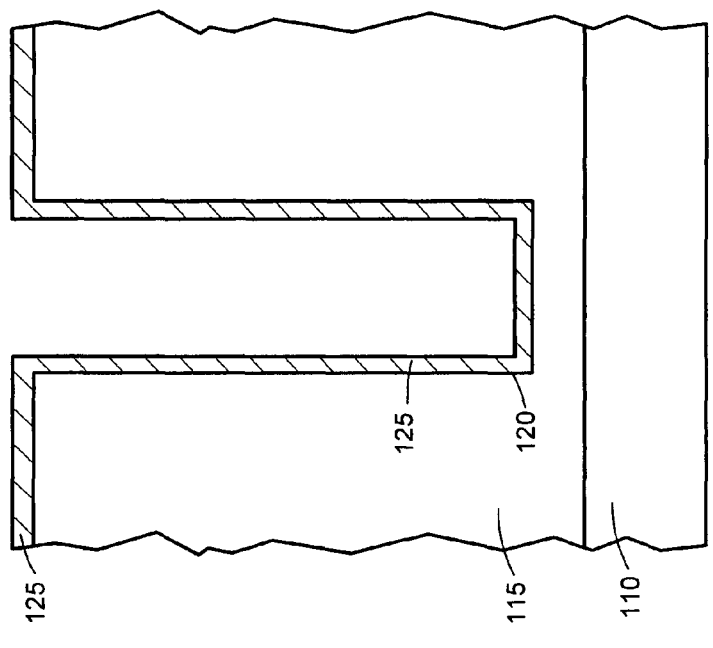
FIG. 3B is a diagram of the substrate from FIG. 3A partially processed according to an embodiment of the present invention.

To further illustrate the process flow presented in FIG. 2, reference is now made to FIG. 3A, FIG. 3B, FIG. 3C, FIG. 3D, and FIG. 3E where there is shown a cross sectional side view of a section of a patterned device wafer processed according to process flow 50 presented in FIG. 2. FIG. 3A shows a patterned device wafer 100A to be processed according to the process flow shown in FIG. 2. Device wafer 100A includes a semiconductor wafer 110 or other substrate for device fabrication and a dielectric layer 115 having a patterned feature such as a trench or via 120. Trench or via 120 may be formed in dielectric layer 115 for damascene or dual damascene structures used for electronic device metallization.

FIG. 3B shows a patterned device wafer 100B that is essentially the same as the patterned device wafer described in FIG. 3A. Device wafer 100B includes a semiconductor wafer 110 or other substrate for device fabrication and a dielectric layer 115 having a patterned feature such as a trench or via 120. Patterned device wafer 100B also includes a tantalum nitride layer 125 deposited by atomic layer deposition. Tantalum nitride layer 125 is deposited so that it is effective as a diffusion barrier for copper gapfill. The deposition of tantalum nitride layer 125 is accomplished by atomic layer deposition so as to provide substantially conformal coverage that is uniform and substantially continuous.

FIG. 3C shows a patterned device wafer 100C that is essentially the same as the patterned device wafer described in FIG. 3B. Device wafer 100C includes a semiconductor wafer 110 or other substrate for device fabrication, a dielectric layer 115 having a patterned feature such as a trench or via 120, and a tantalum nitride layer 125 deposit as a metallization diffusion barrier by atomic layer deposition. Patterned device wafer 100C also includes ALD ruthenium 130 which is an atomic layer deposition portion of a ruthenium seed layer. The ruthenium seed layer is a copperless seed layer for direct electrochemical plating copper gapfill. The deposition of ALD ruthenium 130 is accomplished by atomic layer deposition so as to provide substantially conformal coverage that is uniform and substantially continuous. Another benefit of using atomic layer deposition for ALD ruthenium 130 is the high degree of thickness control that is characteristic of atomic layer deposition.

Figure 3D:
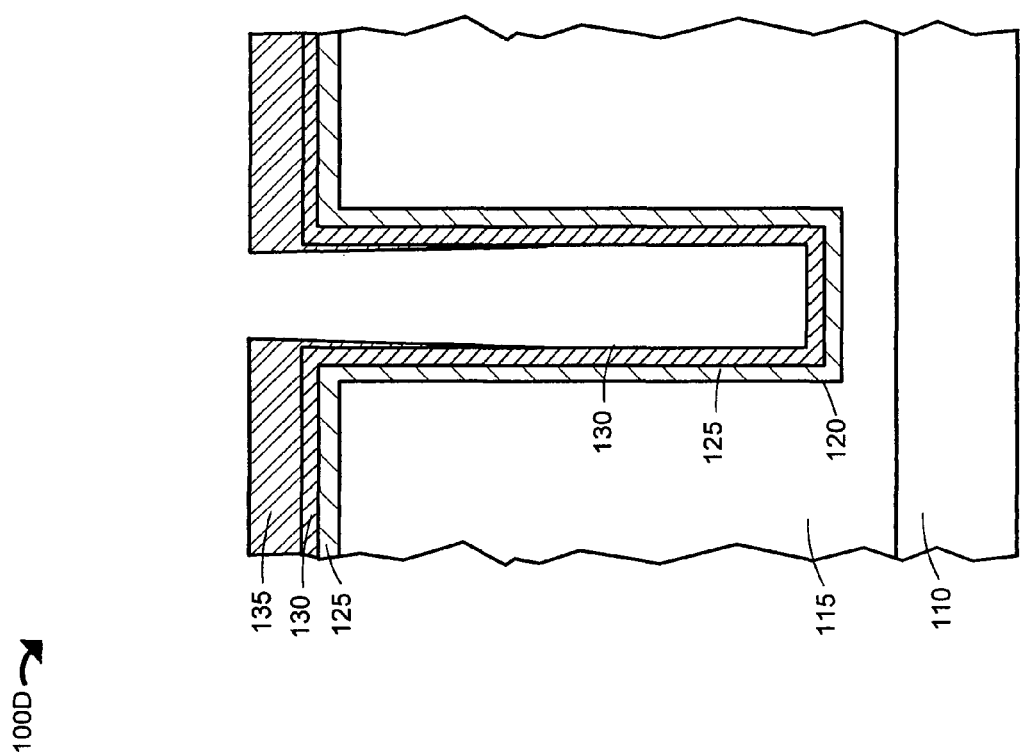
FIG. 3D is a diagram of the substrate from FIG. 3A partially processed according to an embodiment of the present invention.

FIG. 3D shows a patterned device wafer 100D that is essentially the same as the patterned device wafer described in FIG. 3C. Device wafer 100D includes a semiconductor wafer 110 or other substrate for device fabrication, a dielectric layer 115 having a patterned feature such as a trench or via 120, a tantalum nitride layer 125 deposit as a metallization diffusion barrier by atomic layer deposition, and ALD ruthenium 130 which is an atomic layer deposition portion of a ruthenium seed layer. Patterned device wafer 100D also includes CVD ruthenium 135 which is a nonconformal chemical vapor deposition portion of the ruthenium seed layer. The ruthenium seed layer is a copperless seed layer for direct electrochemical plating copper gapfill. According to one embodiment of the present invention, the ruthenium seed layer includes two portions: ALD ruthenium 130 and CVD ruthenium 135.

The deposition of CVD ruthenium 135 is accomplished by chemical vapor deposition using process conditions that provide substantially nonconformal coverage. Preferably, a uniform deposit of CVD ruthenium 135 is formed on the top surface of the device wafer but additional deposition into the features such as vias and trenches is minimized or substantially prevented. This means that a thick layer of CVD ruthenium 135 can be formed on the top surface of the device wafer without increasing the amount of ruthenium in the features significantly enough to interfere with electrochemical plating copper gapfill in the features. A sufficient amount of CVD ruthenium 135 is deposited so as to make the electrical resistance for the device wafer low enough for direct electroplating copper gapfill onto the ruthenium seed layer.

Figure 3E:
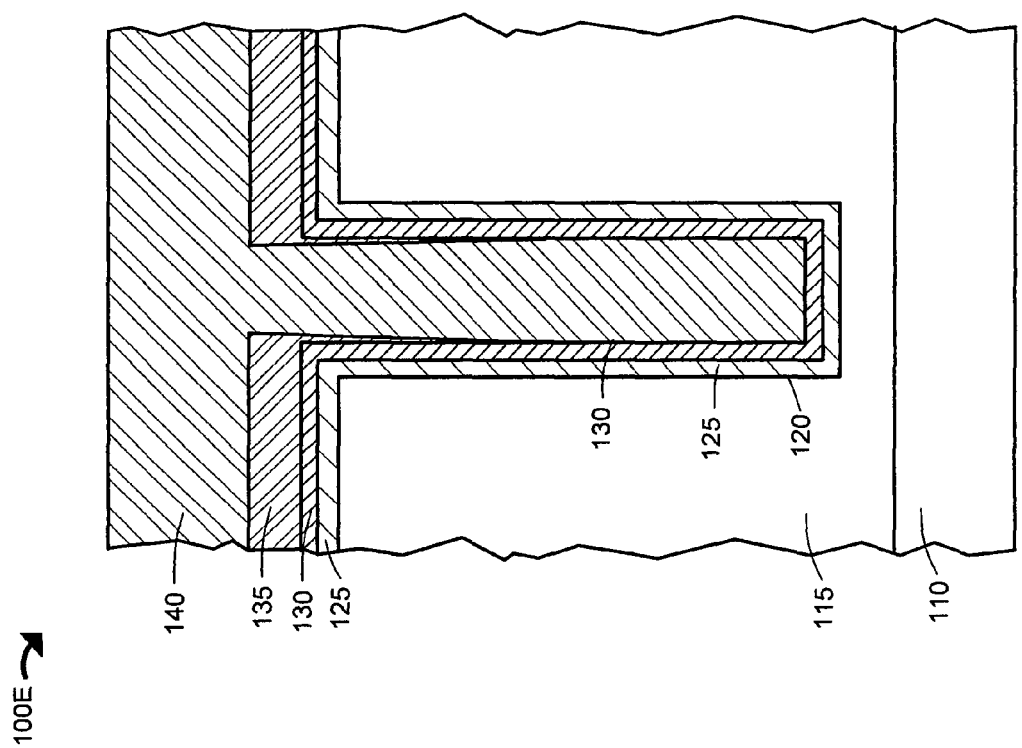
FIG. 3E is a diagram of the substrate from FIG. 3A processed according to an embodiment of the present invention.

FIG. 3E shows a patterned device wafer 100E that is essentially the same as the patterned device wafer described in FIG. 3D with the exception of also having an electrochemically plated copper gapfill 140. FIG. 3E shows the copper filling the gap in the feature and overburden copper on the surface. Further processing of patterned device wafer 100E may include well-known process steps that may include removal and planarization of overburden materials, metallization passivation, and further processing to complete the fabrication of electronic devices.

Another embodiment of the present invention is a seed layer for electrochemical plating of copper metallization in a semiconductor device structure. A diagram of the seed layer is presented in FIG. 3E which shows a cross-sectional side view of a patterned device wafer 100E as described above. The seed layer comprises a conformal deposit of a portion of the seed layer, shown in FIG. 3E as ALD ruthenium 130, and a nonconformal deposit of a portion of the seed layer, shown in FIG. 3E as CVD ruthenium 135.

It is to be understood that the seed layer shown in FIG. 3E is a preferred embodiment that uses ruthenium as a material for the seed layer; however, other embodiments of the present invention may include a material other than ruthenium for the seed layer. The seed layer shown in FIG. 3E is formed on a tantalum nitride diffusion barrier according to a preferred embodiment of the present invention. As an alternative for other embodiments of the present invention, the seed layer may be deposited on other barrier layers such as, but not limited to, tantalum, tungsten nitride, tungsten carbon nitride, tantalum nitride, tantalum carbon nitride, titanium nitride, titanium silicon nitride, or combinations thereof. According to a preferred embodiment of the present invention, the barrier layer is a diffusion barrier for copper metallization.

According to one embodiment of the seed layer, the conformal portion of the deposit is formed by atomic layer deposition or chemical vapor deposition and the nonconformal portion of the deposit is formed by chemical vapor deposition or physical vapor deposition. Examples of physical vapor deposition processes that may be suitable for some embodiments of the present invention include, but are not limited to, metal evaporation and sputtering.

A variety of options exists for the equipment and systems that can be used for carrying out process steps for embodiments of the present invention. A particularly useful system and equipment configuration for practicing embodiments of the present invention is a controlled environment processing system such as those described in commonly owned U.S. patent application Ser. No. 11/641,364, filed Dec. 18, 2006, titled "METHODS AND SYSTEMS FOR BARRIER LAYER SURFACE PASSIVATION," to Yezdi DORDI, John BOYD, Fritz REDEKER, William THIE, Tiruchirapalli ARUNAGIRI, and Hyungsuk Alexander YOON; U.S. patent application Ser. No. 11/382,906, filed May 25, 2006; U.S. patent application Ser. No. 11/427,266, filed Jun. 28, 2006; U.S. patent application Ser. No. 11/461,415, filed Jul. 27, 2006; U.S. patent application Ser. No. 11/514,038, filed Aug. 30, 2006; U.S. patent application Ser. No. 10/357,664, filed Feb. 3, 2003; U.S. patent application Ser. No. 10/879,263, filed Jun. 28, 2004; and U.S. patent application Ser. No. 10/607,611, filed Jun. 27, 2003; all of these patents and/or applications are incorporated herein, in their entirety, by this reference.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A method of manufacturing a semiconductor device having copper metallization, the method comprising:
providing a patterned semiconductor device wafer;
using atomic layer deposition to deposit a tantalum nitride diffusion barrier for copper;
depositing a ruthenium seed layer by atomic layer deposition to form a conformal portion of the seed layer and chemical vapor deposition to form a nonconformal portion of the seed layer so that the seed layer is effective for direct electrochemical deposition of gapfill copper, wherein the atomic layer deposition excludes oxygen compounds or oxygen and is performed before the chemical vapor deposition; and
electroplating a copper gapfill layer onto the ruthenium seed layer.

2. The method of claim 1, wherein the atomic layer deposition and chemical vapor deposition exclude oxygen compounds or oxygen.

3. The method of claim 1, wherein the chemical vapor deposition includes oxygen compounds or oxygen.

4. The method of claim 1, wherein the atomic layer deposition uses a precursor ruthenium compound selected from the group consisting of bis(cyclopentadienyl) ruthenium (II), bis(ethyl cyclopentadienyl) ruthenium (II), bis(isopropyl cyclopentadienyl) ruthenium (II), bis(methyl cyclopentadienyl) ruthenium (II), bis(ethyl cyclopentadienyl) ruthenium (II)+hydrogen radicals, and (2,4-dimethylpentadienly)(ethylcyclopentadienyl) ruthenium; and the chemical vapor deposition includes oxygen compounds or oxygen and uses a precursor ruthenium compound selected from the group consisting of ruthenium acetylacetonate (II), tris(tetramethylheptanedionato) ruthenium (III), tricarbonyl clyclopentadienyl ruthenium (I), bis(ethyl cyclopentadienyl) ruthenium (II)+oxygen, and dodecacarbonyl triruthenium (0).

5. The method of claim 1, wherein the atomic layer deposition uses a precursor ruthenium compound selected from the group consisting of bis(cyclopentadienyl) ruthenium (II), bis(ethyl cyclopentadienyl) ruthenium (II), bis(isopropyl cyclopentadienyl) ruthenium (II), bis(methyl cyclopentadienyl) ruthenium (II), bis(ethyl cyclopentadienyl) ruthenium (II)+hydrogen radicals, and (2,4-dimethylpentadienly)(ethylcyclopentadienyl) ruthenium.

6. The method of claim 1, wherein the chemical vapor deposition includes oxygen compounds or oxygen and uses a precursor ruthenium compound selected from the group consisting of ruthenium acetylacetonate (II), tris(tetramethylheptanedionato) ruthenium (III), tricarbonyl clyclopentadienyl ruthenium (I), bis(ethyl cyclopentadienyl) ruthenium (II)+oxygen, and dodecacarbonyl triruthenium (0).

7. A method of forming a semiconductor device having copper metallization comprising:
providing a patterned wafer having a diffusion barrier for copper;
depositing a copperless seed layer on the diffusion barrier effective for direct electrochemical deposition of gapfill copper, the seed layer being formed by a conformal chemical vapor deposition that excludes oxygen compounds or oxygen or an atomic layer deposition process that excludes oxygen compounds or oxygen and by a nonconformal chemical vapor deposition process; and
electroplating copper gapfill onto the seed layer.

8. The method of claim 7, wherein the diffusion barrier comprises tantalum nitride.

9. The method of claim 7, wherein the seed layer comprises ruthenium.

10. The method of claim 7, wherein the seed layer is substantially pure ruthenium.

11. The method of claim 7, wherein the seed layer is ruthenium and the diffusion barrier comprises tantalum nitride.

12. The method of claim 7, wherein the conformal deposition process is atomic layer deposition.

13. The method of claim 7, wherein the conformal deposition process is chemical vapor deposition.

14. The method of claim 7, wherein the nonconformal deposition process is chemical vapor deposition.

15. The method of claim 7, wherein the conformal deposition process is accomplished by atomic layer deposition and the nonconformal deposition process is accomplished by chemical vapor deposition.

16. The method of claim 7, wherein the nonconformal deposition process produces a thicker deposit over the field areas than in the patterned features.

17. The method of claim 7, wherein the nonconformal deposition process produces a deposit having an electrical resistance suitable for electrochemical plating gapfill copper.

* * * * *